United States Patent [19]
Cipolla et al.

[11] Patent Number: 5,343,366
[45] Date of Patent: Aug. 30, 1994

[54] PACKAGES FOR STACKED INTEGRATED CIRCUIT CHIP CUBES

[75] Inventors: Thoas M. Cipolla, Katonah; Paul W. Coteus, Yorktown Heights, both of N.Y.; Ioannis Damianakis, Montreal, Canada; Glen W. Johnson, Yorktown Heights, N.Y.; Peter G. Ledermann, Peekskill; Linda C. Matthew, Peekskill, N.Y.; Lawrence S. Mok, Yorktown Heights, N.Y.

[73] Assignee: International Business Machines Corporation, Armonk, N.Y.

[21] Appl. No.: 903,838

[22] Filed: Jun. 24, 1992

[51] Int. Cl.⁵ ............................................. H01R 23/68
[52] U.S. Cl. ................................... 361/785; 257/685; 257/686; 257/723; 361/735; 361/744; 361/749; 361/807; 361/809
[58] Field of Search ............... 257/685, 686, 723, 777, 257/700; 361/393, 394, 396, 400, 412, 413, 729, 736, 744, 749, 760, 772, 773, 774, 784, 790, 792, 807, 808, 809, 810; 437/205, 208, 915; 439/68, 69, 74

[56] References Cited

U.S. PATENT DOCUMENTS

| | | | |
|---|---|---|---|
| 2,568,242 | 9/1951 | Matteson, Jr. | 439/47 |
| 2,602,413 | 7/1952 | Miller | 361/392 |
| 3,113,248 | 12/1963 | Friedman | 361/398 |
| 3,152,288 | 10/1964 | Mittler | 361/412 |
| 3,316,455 | 4/1967 | Hucke, III | 361/396 |
| 3,492,538 | 1/1970 | Fergusson | 361/412 |
| 3,515,949 | 6/1970 | Michaels et al. | 361/396 |
| 3,705,332 | 12/1972 | Parks | 361/414 |
| 3,766,439 | 10/1973 | Isaacson | 361/398 |
| 4,237,522 | 12/1980 | Thompson | 228/180.2 |
| 4,396,140 | 8/1983 | Jaffe et al. | 361/398 |
| 4,426,689 | 1/1984 | Henle et al. | 361/398 |

(List continued on next page.)

FOREIGN PATENT DOCUMENTS

1-289191 11/1989 Japan ........................... 439/65

Primary Examiner—Leo P. Picard
Assistant Examiner—Donald A. Sparks
Attorney, Agent, or Firm—Daniel P. Morris

[57] ABSTRACT

This invention relates to three dimensional packaging of integrated circuit chips into stacks to form cuboid structures. Between adjacent chips in the stack, there is disposed an electrical interconnection means which is a first substrate having a plurality of conductors one end of which is electrically connected to chip contact locations and the other end of which extends to one side of the chip stack to form a plurality of pin-like electrical interconnection assemblies. The pin-like structures can be formed from projections of the first substrate having an electrical conductor on at least one side thereof extending from this side. Alternatively, the pin-like structures can be formed from conductors which cantilever from both sides of an edge of the first substrate and within which corresponding conductors from both sides are aligned and spaced apart by the first substrate thickness. The spaces contain solder and form solder loaded pin-like structures. The pin-like structures can be directly solder bonded to conductors on a second substrate surface or the pin-like structures can be adapted for insertion into apertures in a second substrate. The second substrate provides a means for electrically interconnecting a plurality of these cuboids. Preferably, the first and second substrates are circuitized flexible polymeric films. The second substrate is disposed on a third substrate, such as a PC board, with a resilient material therebetween which permits a heat sink to be pressed into intimate contact with an opposite side of the cuboid structures.

39 Claims, 11 Drawing Sheets

U.S. PATENT DOCUMENTS

| | | | |
|---|---|---|---|
| 4,517,625 | 5/1985 | Frink et al. | 361/415 |
| 4,549,200 | 10/1985 | Ecker et al. | 361/397 |
| 4,574,331 | 3/1986 | Smolley | 361/393 |
| 4,658,332 | 4/1987 | Baker et al. | 361/398 |
| 4,661,887 | 4/1987 | Lin | 361/405 |
| 4,703,984 | 11/1987 | Mitchell, Jr. | 361/398 |
| 4,755,866 | 7/1988 | Marshall et al. | 361/398 |
| 4,764,846 | 8/1988 | Go | 361/388 |
| 4,770,640 | 9/1988 | Walter | 361/393 |
| 4,773,868 | 9/1988 | Heinecke | 361/393 |
| 4,790,894 | 12/1988 | Homma et al. | 228/180.2 |
| 4,830,264 | 5/1989 | Bitaillou et al. | 228/180.2 |
| 4,868,712 | 9/1989 | Woodman | 361/396 |
| 4,886,461 | 12/1989 | Smith | 439/67 |
| 4,916,575 | 4/1990 | Van Asten | 361/399 |
| 4,922,376 | 5/1990 | Pommer et al. | 361/400 |
| 4,953,058 | 8/1990 | Harris | 361/398 |
| 4,956,694 | 9/1990 | Eide | 361/396 |
| 4,956,746 | 9/1990 | Gates, Jr. et al. | 361/396 |
| 4,972,298 | 11/1990 | Casa et al. | 361/393 |
| 4,983,533 | 1/1991 | Go | 361/388 |
| 5,003,429 | 3/1991 | Baker et al. | 361/398 |
| 5,031,072 | 7/1991 | Malhi et al. | 361/393 |
| 5,037,311 | 8/1991 | Frankeny et al. | 439/74 |
| 5,041,903 | 8/1991 | Millerick et al. | 361/398 |
| 5,050,039 | 9/1991 | Edfors | 361/400 |

PACKAGES FOR STACKED INTEGRATED CIRCUIT CHIP CUBES

COPENDING RELATED APPLICATION

Copending U.S. application, Ser. No. 07/760,038, now U.S. Pat. No. 5,239,447 filed Sep. 13, 1991, entitled "Stepped Electronic Device Package" describes an electronic device packaging structure wherein an electronic device is electrically connected to a substrate wherein the electronic device subtends a non-normal angle with respect to the substrate. In a more specific embodiment, a plurality of electronic devices are stacked at an offset with respect to each other to expose contact locations on the surface of each electronic device at an edge of each electronic device to from a stepped surface exposing a plurality of electronic device contact locations. This surface is disposed adjacent a substrate having a plurality of contact locations thereon. The electronic device contact locations can be electrically interconnected to the substrate contact locations by solder mounds or alternatively by a cylindrical shaped elastomeric body having metallization bands with a spacing corresponding to the electronic device contact locations. The elastomeric body is pressed between the edge of the stacked electronic devices having the contact locations thereon and substrate surface to form electrical interconnections between electronic device contact locations and substrate contact locations through the electrically conducting bands. The stacked electronic devices can be thermally connected to a heat dissipation means. The stacked electronic devices can have a stepped surface embodying an enhanced area for transfer of heat from the electronic device stack to the heat dissipation means.

FIELD OF THE INVENTION

This invention relates to three dimensional packaging of integrated circuit chips into stacks to form cuboid structures. More particularly, between adjacent chips in the stack there is disposed an electrical interconnection means which is a first substrate having a plurality of conductors one end of which is electrically connected to chip contact locations and the other end of which extends to one side of the chip stack to form a plurality of electrical conductors extending from this side. More particularly, the conductors extending from this side can be adapted for surface mounting on a second substrate or for insertion into apertures in a second substrate which provides means for electrically interconnecting a plurality of these cubes. More particularly, the first and second substrates are circuitized flexible polymeric films. More particularly, of the first substrate has conductors on both sides which cantilever from a first substrate edge and contain solder disposed therebetween which is used for solder contact to contact pads on the second substrate.

BACKGROUND OF THE INVENTION

To reduce the cost and increase the performance of electronic computers, it is desirable to place as many electronic circuits in as small a region as possible in order to reduce the distance over which electrical signals must travel from one circuit to another. This can be achieved by fabricating, on a given area of a semiconductor chip, as many electronic circuits as feasible with a given fabrication technology. Typically, these dense chips are disposed on the surface of a substrate in a side by side arrangement with space left therebetween to provide regions for electrical conductors for electrical interconnection of the chips. The chip contact locations can be electrically connected to substrate contact locations by means of wires bonded between the chip contact locations and the substrate contact locations. Alternatively, a TAB (Tape Automated Bonding) tape (which is a flexible dielectric layer having a plurality of conductors disposed thereon) can be used for this electrical connection. Alternatively, the semiconductor chips can be mounted in a flip-chip configuration wherein an array of contact locations on the semiconductor chips is aligned with and electrically connected to an array of contact locations on the substrate by means of solder mounds disposed between corresponding chip and substrate contact locations. The side by side arrangement of electronic devices is not the most dense configuration which can be achieved.

The most dense packaging configuration for semiconductor chips, in particular for memory chips, such as DRAMs SRAMs, Flash EEPROMs and the like, may be obtained through the construction of a cuboid structure of semiconductor chips. The difficult problems to solve for such a cube are providing for electrical connections to the chips, dissipating heat and reworking bad chips. The electrical connections must include power supply, data and address lines and the like.

Prior art shows that it is possible to construct dense packages of stacked semiconductor wafers or chips. The major problems are that of interconnecting the chips electrically and that of solving the problem of thermal dissipation. Chips are generally stacked in orthogonal rectangular or cuboid structures.

Generally, the problem of thermal dissipation is either not addressed or is handled by conduction through the structures to the environment.

The trend in the electronics industry is to package. One approach is to package the chips in a 3-D form factor in which the input and output lines of the chips are brought to one edge of the chip and then multiple chips are glued together to form a cube. Since the chips in the cube are permanently bonded together, it is very difficult to rework. The current technology of doing single-chip test and burn-in is also not compatible with this type of cube packaging.

U.S. Pat. No. 5,031,072 describes making a baseboard for orthogonal mounting of integrated circuit chips. Plural channels are anisotropically etched in a silicon baseboard and a plurality of chips are inserted into the channels. A number of baseboard contact pads are formed adjacent to each channel and are solder bonded to corresponding chip conductor pads. The base board is made of rigid silicon and it requires that a chip must have conduction pads near its edge for bonding to the baseboard. Also, the base board must have channels for the chips to be inserted and thus, the interconnection wires on the baseboard must be routed around the channels. As a result the average length of signal wires is thus longer than desired and the baseboard substantially wider than the footprint of the chips mounted to it.

U.S. Pat. No. 5,037,311 describes an interconnect strip to provide electrical interconnection between a plurality of conductor pads disposed on a plurality of circuit boards. The strip can be fabricated from a polymer film carrier having disposed on both sides thereof, a metal foil with preselected spring properties formed into electrical conductors which have ends which cantilever off two opposed edges of the film. Some of the ends are inserted into slots in the circuit boards to locate the remaining adjacent contact locations on the circuit boards.

U.S. Pat. No. 5,041,903 describes a structure of a tape frame for Tape-Automated-Bonding (TAB) packages. Chips are mounted onto TAB lead frames, a portion of the leads are parallel to the chip and a portion (the outer lead end) of the lead is formed (bent) to allow the tape to be outer lead bonded to a substrate so that the package can be mounted at any desired non-zero angle with respect to a substrate. The bent portion of the outer lead is soldered to a substrate. The bent portion limits the spacing between adjacent packages to approximately between 50 and 150 mils which is the length of the bent outer lead needed to form a solder bond to the substrate.

U.S. Pat. No. 2,568,242 is directed to a method of using a solder filled wire having a core of a metal member to store solder in solid form before joining it to another metal member. The member is subsequently sheared so as to place the solder into a non-equilibrium state with the excess solder facilitating a subsequent solder connection to a nearby metal surface.

SUMMARY OF THE INVENTION

An object of the present invention is to provide a new and improved three dimensional packaging structure which can be beneficially used to package memory and logic integrated circuit chips, and a process for fabricating the same.

Another object of the present invention is to provide a structure and method for packaging integrated circuit chips in a cuboid structure of stacked integrated circuit chips.

A further object of the present invention is to provide a packaging structure wherein the contact locations to the integrated circuit chips do not have to be at the chip edge.

An additional object of the present invention is to provide a packaging structure having integrated circuit chips closely spaced in a stack with an electrical interconnection means disposed therebetween which permits the electrical interconnection of the cuboid structure to a substrate with respect to which the chips are at any angle and wherein the electrical interconnection means does not required formed leads.

Yet another object of the present invention is to insert portions of the electrical interconnection means into apertures on the substrate for electrical interconnection thereto.

Yet a further object of the present invention is to provide a packaging structure having an electrical interconnection means which is preloaded with solder.

In its broadest aspect, the present invention is a three dimensional structure for packaging electronic devices, such as semiconductor chips. At least one electronic device is disposed in electrical contact with electrical conductors on at least one side of a first substrate to form a device assembly. Electrical conductors extend to an edge of the first substrate.

In a more particular aspect of the present invention, the electrical conductors at the edge are substantially straight and without bends. The electrical conductors at this edge are disposed adjacent to 4electrical conductors on a second substrate to which they are electrically interconnected.

In another more particular aspect of the present invention, a plurality of the device assemblies are disposed so that each is disposed adjacent to another one with the electronic device of each one of the adjacent device assemblies disposed adjacent to one side of the first substrate.

In another more particular aspect of the present invention, the second substrate is disposed in a third substrate with a resilient material therebetween. The resilient material permits a heat sink to be pressed into immediate contact with each of the device assemblies.

In another more particular aspect of the present invention, the third substrate has electrical conductors which are electrically connected to the electrical conductors on the first assembly.

In another more particular aspect of the present invention, the second substrate has contact locations adapted for electrical interconnection to electrical conductors on the first substrate.

In another more particular aspect of the present invention, the first substrate has an edge with extensions wherein there are electrical conductors on both sides of the extensions to form an electrical contact assembly.

In another more particular aspect of the present invention, conductors from the first and second side of the first substrate extend past an edge of the first substrate. The extended portions from the first and second sides are aligned and spaced apart by the thickness of the first substrate to form a lead assembly.

In another more particular aspect of the present invention, the space in the lead assembly contains solder which is used to interconnect the electrical conductors on the first and second substrates.

In another more particular aspect of the present invention, the lead assemblies and contact assemblies are inserted into the apertures on the second substrate.

BRIEF DESCRIPTION OF THE DRAWINGS

These and other objects, features and advantages of the present invention will become apparent upon a consideration of the following detailed description of the invention when read in conjunction with the drawing Figures, in which.

DETAILED DESCRIPTION

The present invention is a structure and a method of packaging memory chips in a 3-D form factor on a flex circuit while keeping individual chips independent in a way such that each one of them can be replaced freely. The signal lines are in close proximity to a ground plane all the way from the chip to the flex. The use of flex circuit also ensures each of the chips is in good contact with a heat sink or cold plate.

Figure 1:
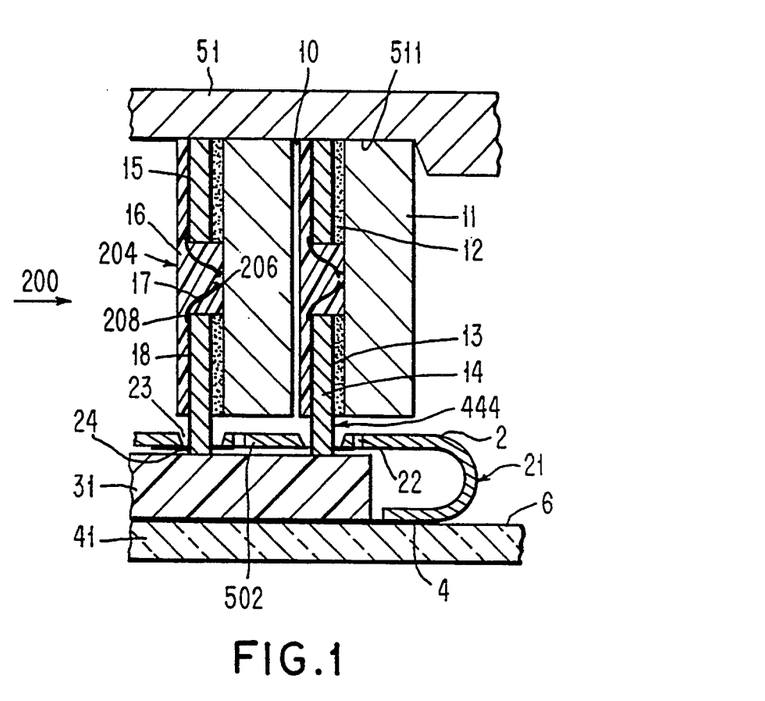
FIG. 1 is a cross-sectional view of a structure of the present invention wherein a plurality of electronic devices are mounted onto a plurality of electronic devices are mounted onto a plurality of first substrates the edges of which are electrically connected to a second substrate which is disposed on a third substrate with a resilient material therebetween.
Figure 2:
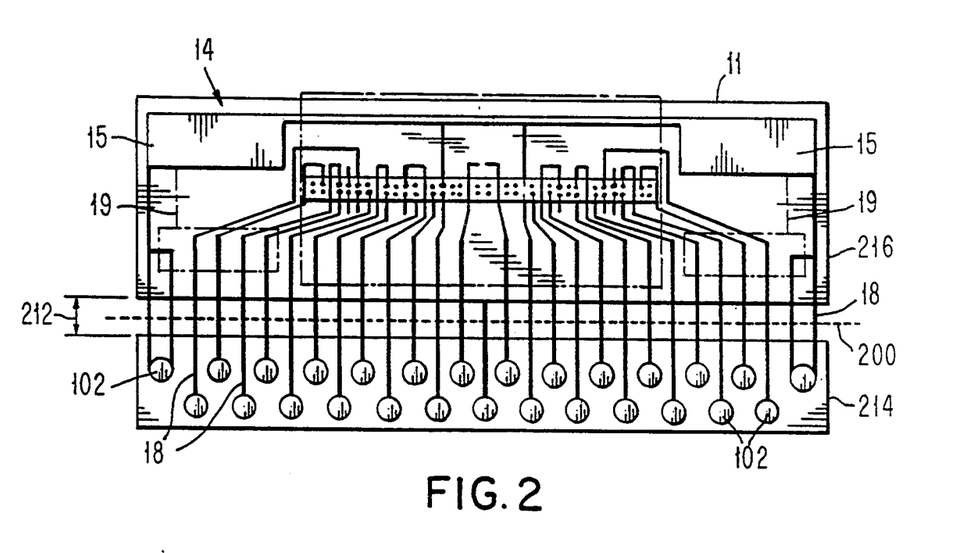
FIG. 2 is a top view of the first substrate of FIG. 1 with an electronic device bonded to the nonvisible side of the first substrate.

A cross-sectional view of multiple chips vertically soldered on a flex (or commonly used TAB type tape) is shown in FIG. 1. For the convenience of illustration, the figure is not drawn to scale, especially the horizontal scale which is greatly exaggerated. The electronic device 11, such as a semiconductor chip or packaging substrate, is first glued to a first flex 14 by an adhesive 12. The adhesive 12 can be an epoxy adhesive. A front view of the first flex 14, in the direction of arrow 200 of FIG. 1 is shown in FIG. 2. First flex 14 preferably contains two layers of gold coated copper wiring or other suitable electrical conductor separated by a thin dielectric layer of preferably polyimide, such as Kapton ®DuPont, or other suitable dielectric. Both electrical conductor bearing surfaces are protected with a polymer except for areas to be electrically accessed. A silicone or other polymer can be used as the protection polymer. It may be screened on, or a photo-imageable solder mask such as LeaRonal 5600Au can be used.

Once the chips are soldered on the flex, the whole assembly is then soldered on a substrate or printed-wiring board 41. An elastomer 31 is placed under the second flex 21 to give a desirable spring force to press the edge 511 of the chips 11 against a heat sink or cold plate 51. Thermal grease such as silicone filled with zinc oxide is disposed between the heat sink and edges of the chips. The heat sink will dissipate the heat away from the chips. Since the second flex 21 is flexible, the edge of the chips is maintained in good contact with the heat sink by the elastomer 31. This is desirable to ensure an even cooling to each chip without the costly precision alignment of the chips. The elastomer 31 can be made of a thermally conductive polymer, such as silicone filled with thermally conductive particles if cooling of the chips from the substrate 41 side is needed. Note that the chips in this package are physically independent and hence each of them can be replaced at any time by reflowing the solder and removing the assembly of chip 11 attached to the first flex 14 for solder connection to the second flex 21.

Figure 3:
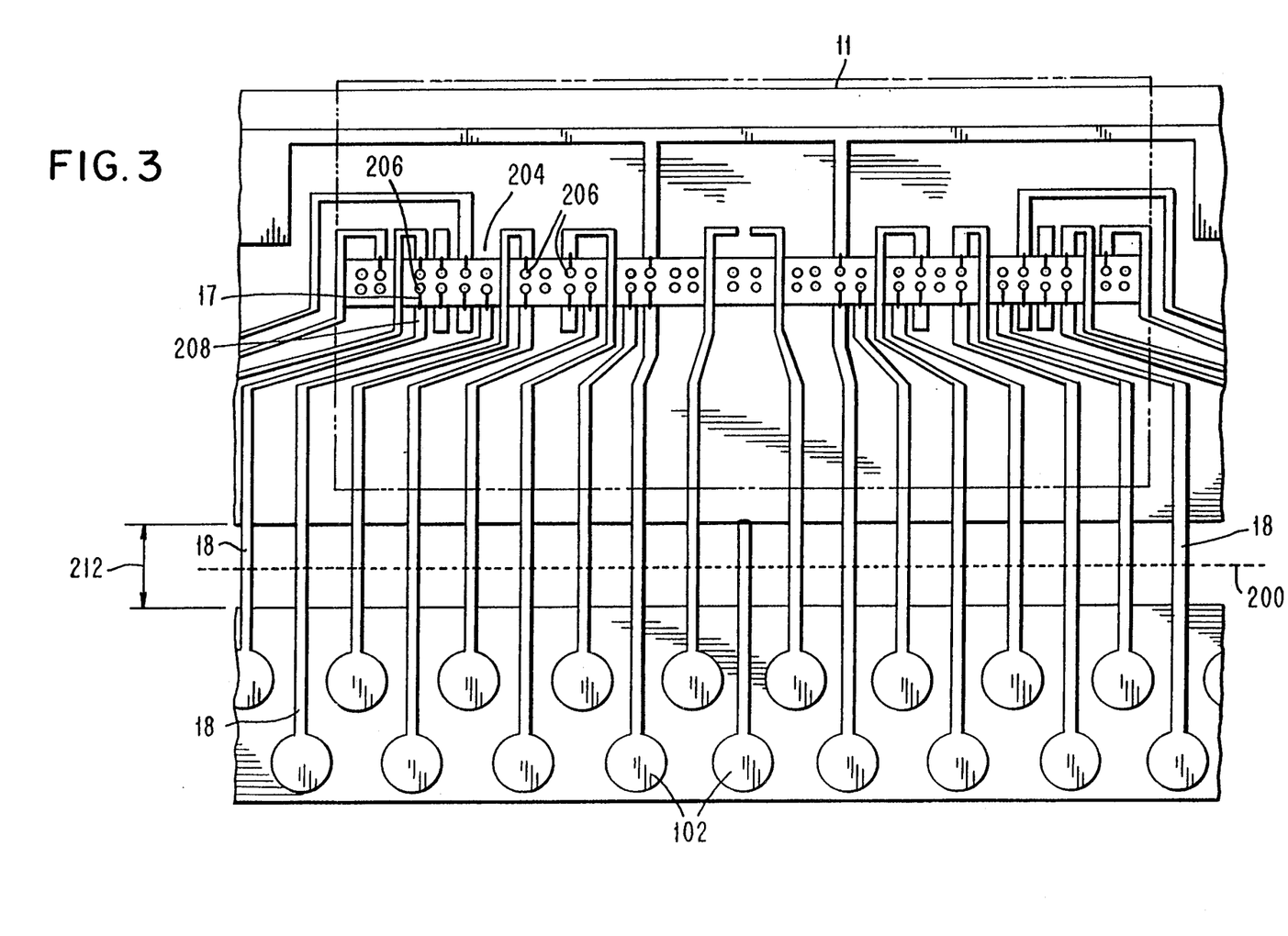
FIG. 3 is an enlarged view of the region of FIG. 2 where electronic device contact locations are electrically interconnected to electrical conductors on the first substrate.

FIG. 3 is an enlarged view of the region of the flex tape 14 about aperture 204 showing wires 17 bonded between chip contact locations 206 and flex contact locations 208.

Figure 4:
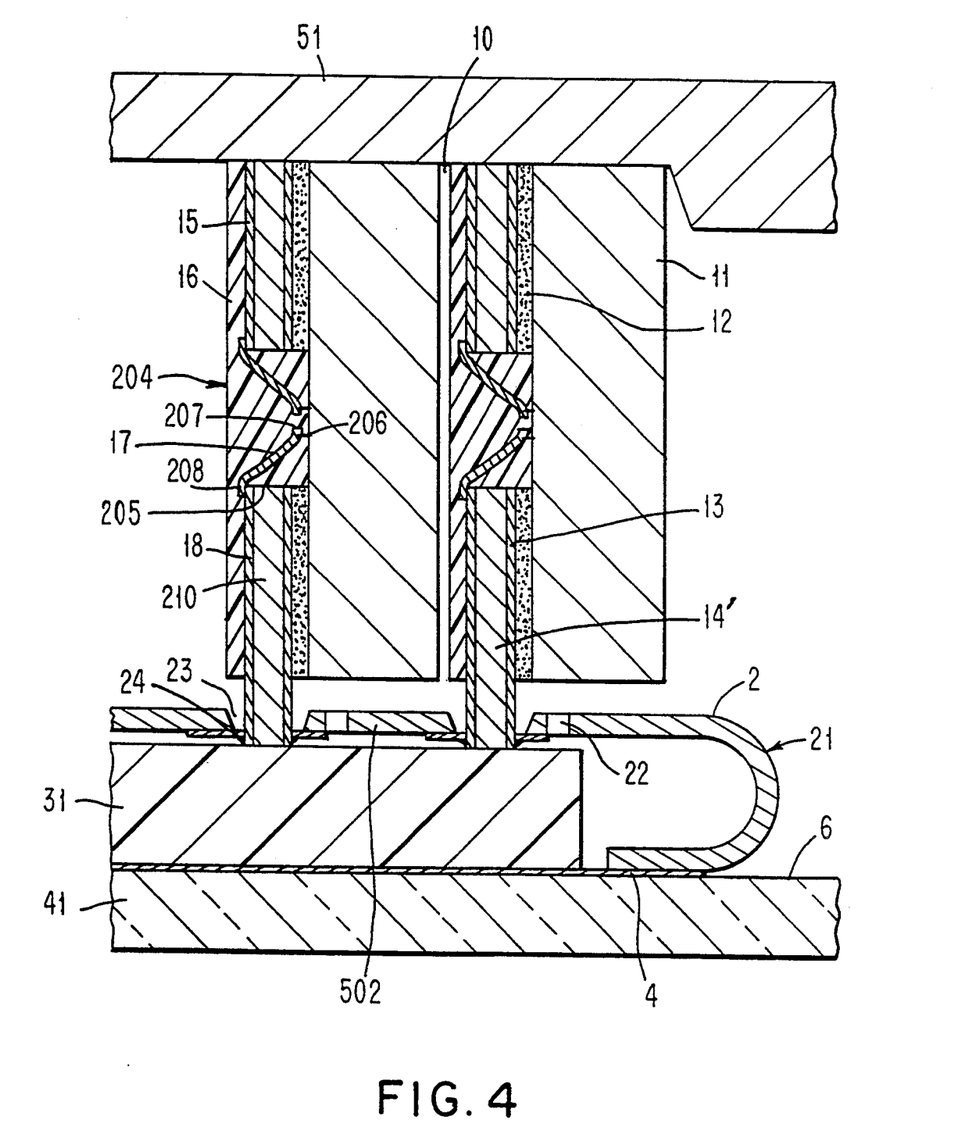
FIG. 4 is an enlarged view of the region of FIG. 1 showing a cantilevered lead alternate embodiment of the means for electrically interconnecting electronic device contact locations to electrical conductors on the first substrate.

FIG. 4 shows an alternate embodiment to the structure of FIG. 1 wherein the electrical interconnection means between the second flex 21 and chip pads 206 is a TAB type flex tape 14'. Tape 14' has inner lead bond ends 207 of leads 15 which cantilever over the edge 205 of aperture 204 and are directly bonded to the chips pads 206 by solder bonding, thermocompression bonding, ultrasonic bonding and the like. Single layer and multiple layer TAB tape (and methods of fabrication) for electrical interconnection of semiconductor chips is described in U.S. Pat. No. 5,028,983 issued Jul. 2, 1991 to Bickford et al., the teaching of which is incorporated herein by reference. As described in Bickford et al., signal and power leads can cantilever over the edge of the aperture from one side of the dielectric layer 210. The first flex 14 can have a continuous ground plane 13 (on the side non visible in FIG. 2) on one side and power and signal lines 15 and 18, respectively, on the other side with a polymer film in between. An example of the power and signal lines on the small flex 14 is shown in FIG. 2. An optional de-coupling capacitor 19 (shown in phantom since it is mounted in the nonvisible side of the first flex 14 in FIG. 2) can be added to the first flex 14 as shown in FIG. 2. An alternative way to package the de-coupling capacitors is to put all of the capacitors on one specially designed first flex.

Returning to FIG. 1, the chip I/O 206 and the lines 18 on the first flex 14 are connected by wires 17 using a conventional wire bonding technique. After wire bonding, the chip is encapsulated with polymer 16, such as an epoxy or other commonly used encapsulants. Typically, the side of the chip to which the electrical interconnections are made is encapsulated. At this stage, each chip can be tested and burned-in using the probe pads 102 on the first flex 14. After burn-in and test, the first flex 14 as shown in FIG. 2 is cut at the dotted line 200 as indicated in FIG. 2. A plurality of chip assemblies are then inserted into the vias or apertures 23 on the second flex 21. All of the chips can now be soldered on the second flex by any well known soldering methods such as solder reflowing using a hot-gas soldering tools.

Figure 5:
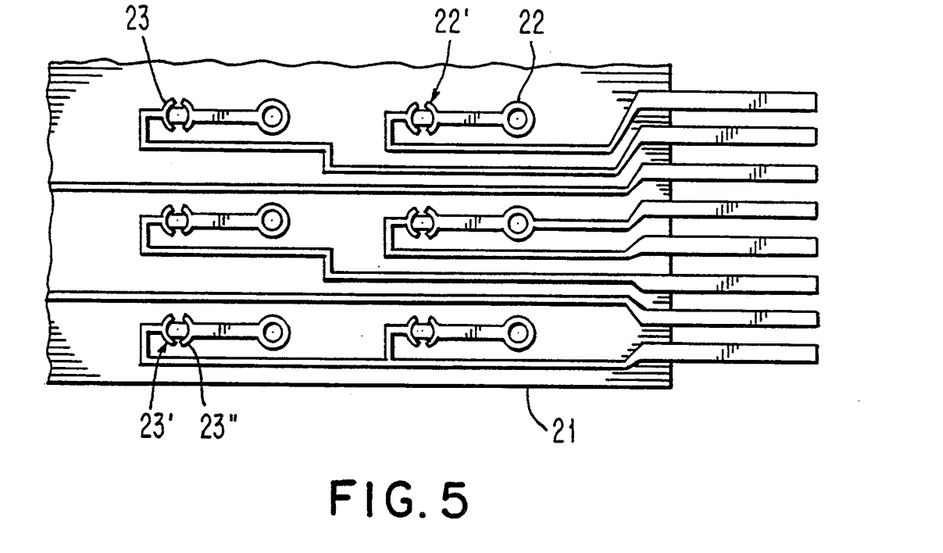
FIG. 5 is a bottom view of the interconnection region of the second substrate of FIG. 4.

There are two types of vias or apertures 23 on the main flex 21. FIG. 5 shows split, non-conducting vias or apertures 23, in which the vias are not electrically conducting across the flex. The split vias or apertures 23 are made by over etching the polymer of the second flex 21 (see FIG. 4) such that no metal is present around the vias on the ground-plane side 502 of the second flex 21. As a result, the solder fillets 24 are only formed on one side of the second flex 21 and the electrical connections are made on that side of the flex only. The solder 24 fillet is formed by conventional liquid solder application. Alternatively, solder is plated or screened onto the bond site and reflowed. The split vias 23, therefore, provides electrically independent connections for the ground and signal lines from the first flex 14 to the second flex 21. The split via has two independent electrically conducting paths 23 and 23'. Each path is electrically interconnected to one conductor on the first flex. In order to minimize the electrical impedance of the ground return path, plated-through, conducting vias 22 connect the split via ground plane contacts to the ground plane on the top side of the second flex 21. An example of these vias along with the wiring of the second flex 21 are depicted in detail in FIG. 5 which shows a partial bottom view of second flex 21.

Figure 6:
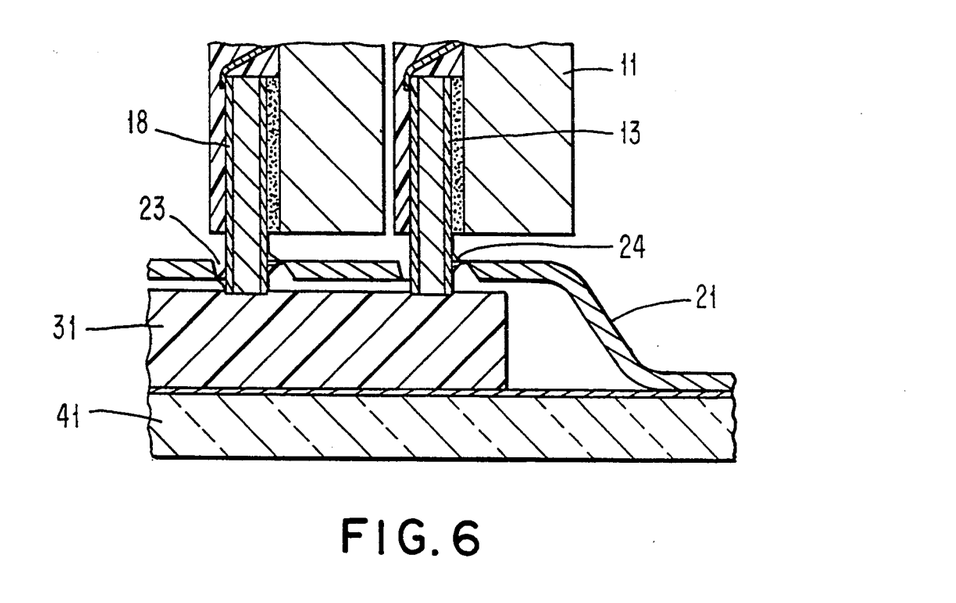
FIG. 6 is a partial view of an alternate embodiment to that of FIG. 1 for electrically interconnecting the second and third substrates.
Figure 7:
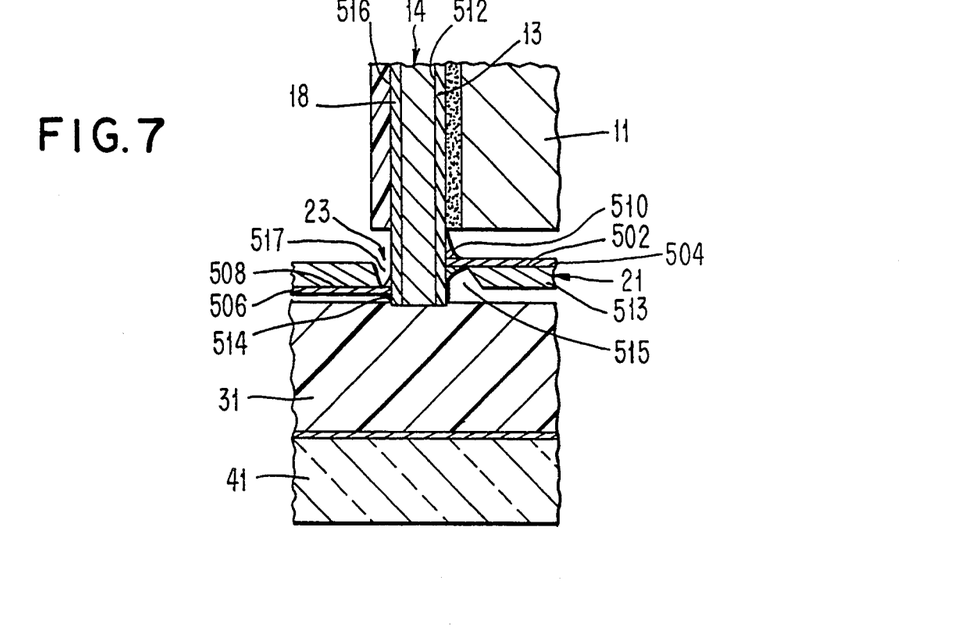
FIG. 7 is an enlarged view of the interconnection of the first and second substrates of FIGS. 6.

Another way of connecting the ground lines on the first flex 14 to the ground plane on the second flex 21 is shown in FIG. 6 and 7. The split vias 23 are over etched selectively on both sides of the main flex such that the signal and ground lines are exposed slightly at the via area at their corresponding sides of the flex. Both the first and second flex are preferably formed from a flexible polymer film having electrically conductive lines on one or both sides. In FIG. 6, second flex 21 has a polymer film 513 which at via 23 is etched back at 515 exposing conductor 510 and etched back at 517 exposing conductor 514. The advantage of using split vias is to have a continuous ground plane from the chip all the way to the main flex.

FIG. 7 is an enlarged view of an alternate interconnection of first flex 14 with via 23 of the second flex 21. The second flex 21 has electrical conductor 504 on side 502 thereof and electrical conductor 506 on side 508 thereof. Solder fillet 510 electrically interconnects electrical conductor 13 on side 512 of the first flex 14 to electrical conductor 504 on side 502 of the second flex 21. Solder fillet 514 electrically interconnects electrical conductor 18 on side 516 of first flex 14 to electrical conductor 506 on side 508 of second flex 21.

Figure 8:
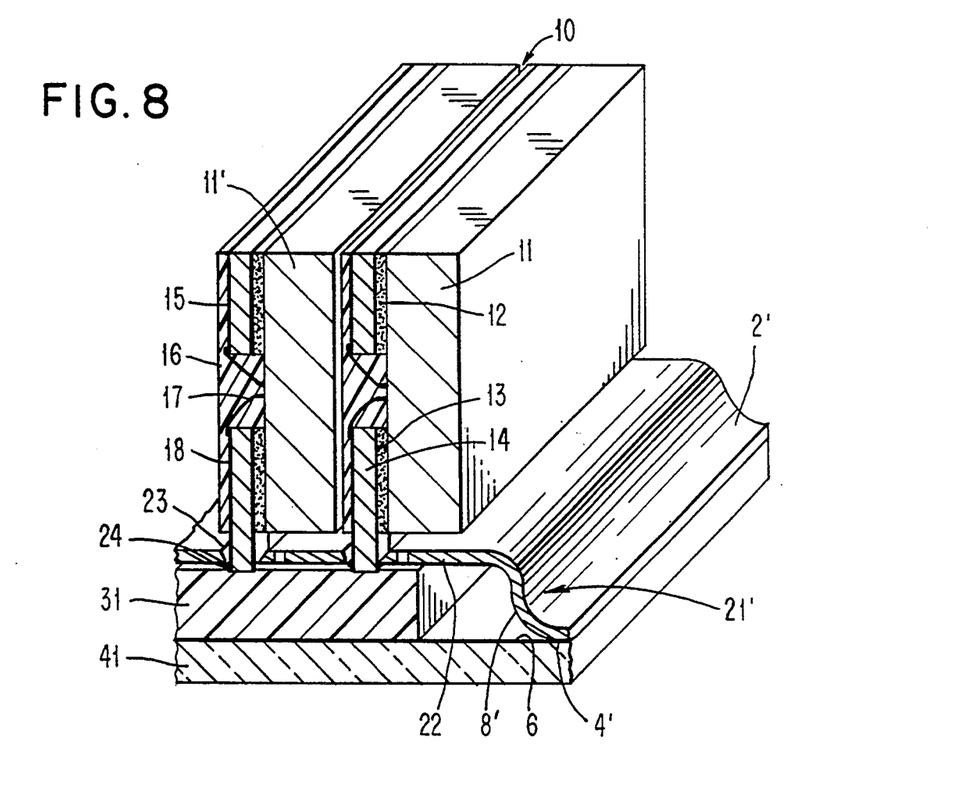
FIG. 8 is a perspective view of the structure of FIG. 7.

FIG. 8 shows a perspective view of a substrate similar to the structure of FIG. 1. Heat sink or cold plate 51 has ben removed to permit a clearer view of the structure. Also, in FIG. 1, the second flex 21 curls downwardly and under to form a "J" shape so that contact locations on side 2 of the second flex 21 are electrically connected to contact locations 4 on surface 6 of substrate 41. The electrical connection is made by any commonly used technique such as solder bonding, thermocompression bonding, ultrasonic bonding and the like. In FIG. 7, all numerals common with FIG. 1 represent the same things. The second flex 21' curls outwardly in an "S" shape or gull-wing shape so that contact locations on side 8' are electrically interconnected with contact locations 4' on surface 6 of substrate 41 (side 8' is the side opposite to side 2 of the second flex 21).

As can be seen from FIG. 1 and FIG. 8, space 10 between chip 11' and the adjacent first flex 14 is very small and approaches zero if the adjacent chips are pressed together. An adhesive can be disposed to fill space 10 to form a structure which is rigidly held together. However, if an adhesive is not used, each assembly comprising chip 11 and first flex 14 can be individually disassembled to permit easy removal of a defective chip. Since a variable space is permissible between each assemble, different thicknesses of chips (such as chip to chip thickness variation due to processing) can be accommodated.

Figure 9:
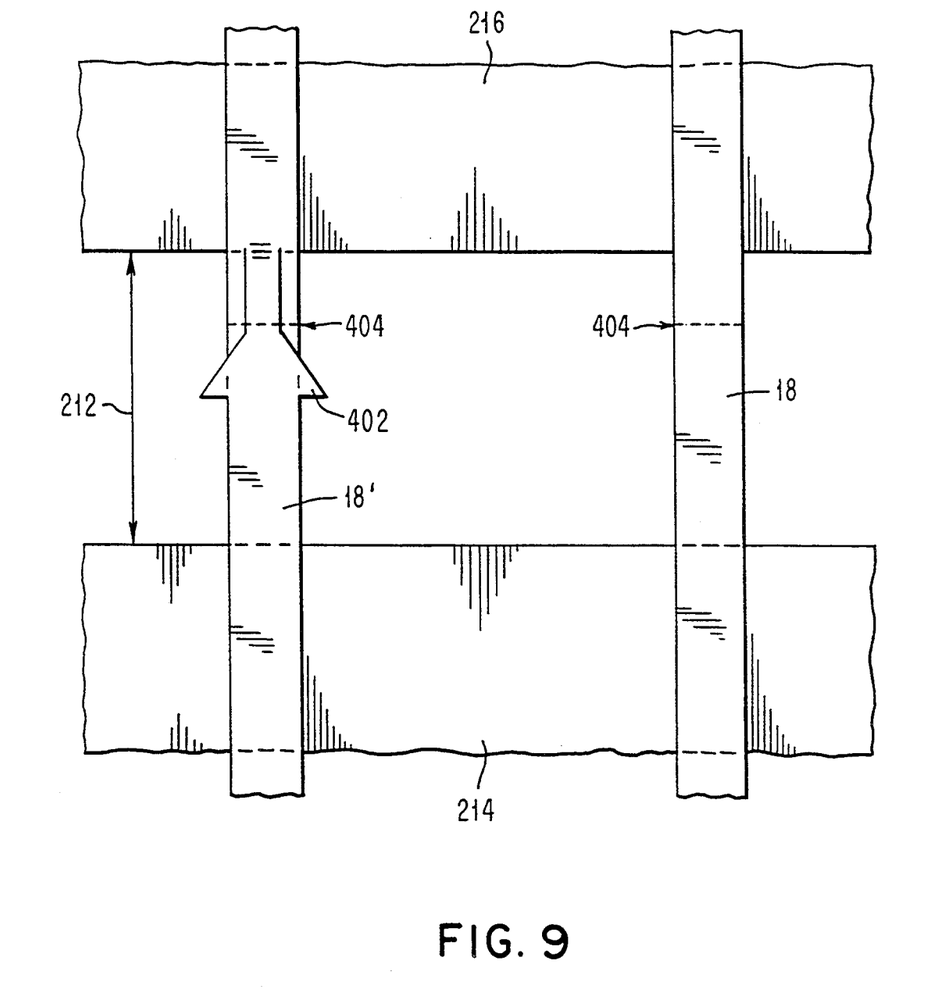
FIG. 9 shows two embodiments of those portions of conductors 18 spanning gap 212 as shown in FIG. 2.

Referring to FIGS. 2 and 3, that part of leads 18 which spans across gap 212 between dielectric layers 214 and 216 can have various structures, as shown in FIG. 9. Lead 19' has arrow shape such that the pin will lock mechanically after insertion into the apertures of the second flex, with the shoulder 402 locking against the square hole of the aperture (for example, 862', 864' and 866' in FIGS. 15, 16 and 17 respectively).

Figure 10:
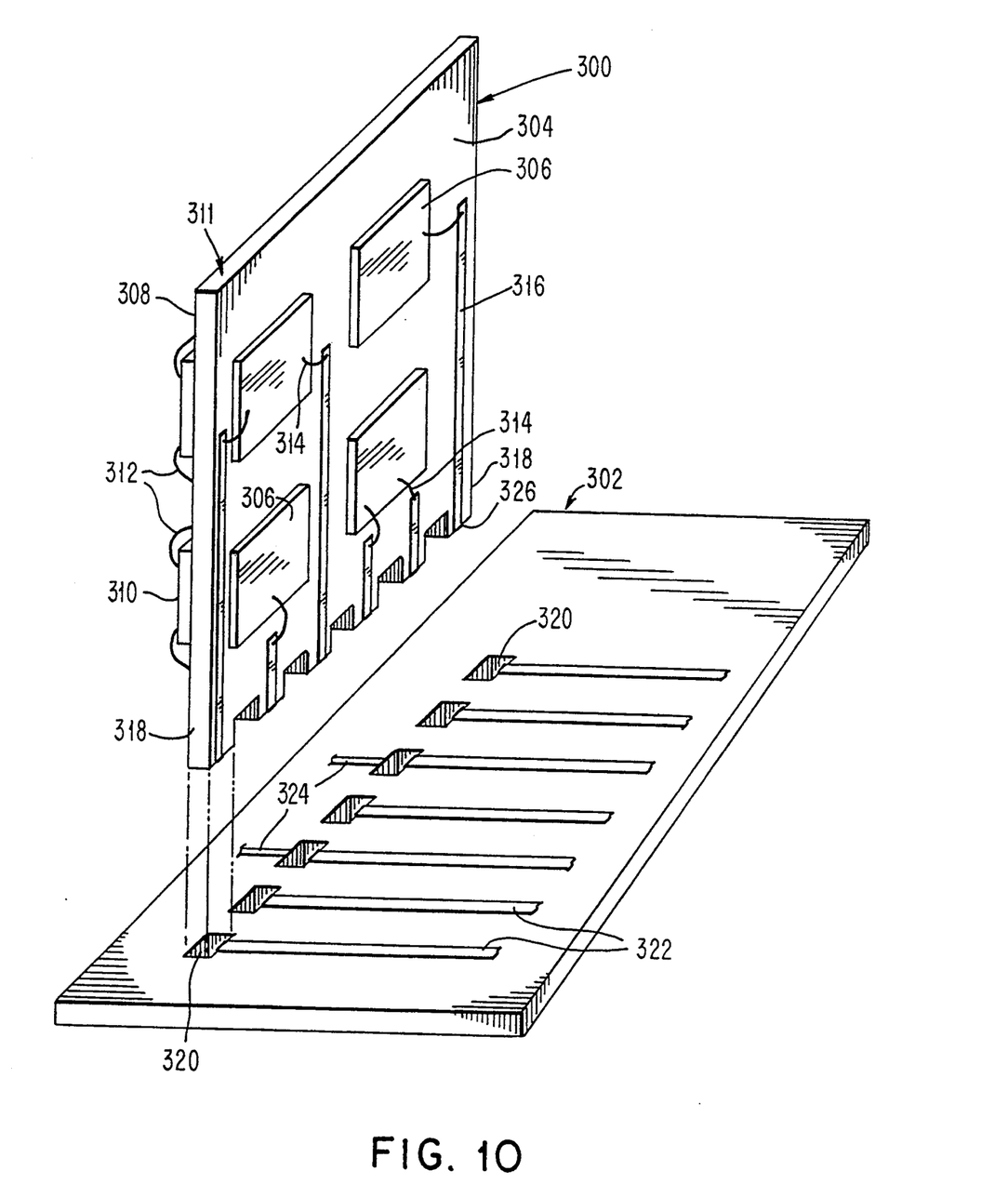
FIG. 10 is a schematic partial disassembled view of the first substrate having a plurality of conductor assemblies for insertion into a plurality of apertures in the second substrate.

FIG. 10 is a schematic diagram showing in perspective partially disassembled view of how first flex 300 is physically and electrically connected to second flex 302. Although the invention is being described with reference to flex tape, flex is not required, rigged substrates, such as printed circuit boards, metallized ceramics and metallized silicon wafers can be used (for the first, second and third flexes). Flex 300 can have disposed, on side 304, a plurality of electronic devices, such as semiconductor chips and decoupling capacitors which can be electrically connected by wires (or other electrically conducting means) 314 to conductors 316 on side 304. On the opposite side 308 of flex 300, there can also be disposed a plurality of electronic devices 310 which can be bonded by wires (or other electrically conducting means) 312 to conductors not shown on side 308.

Flex 300 has a plurality of pin-like projections 318, which are described herein below. Pin-like members 318 are adapted for insertion into a plurality of apertures 320, on second flex 302 for electrical connection of conductors 316 and conductors on the side 308 of the pin-like members 318 which are not visible to conductors 322 and 324 of second flex 302. Although in one embodiment the pin-like members 318 are inserted into apertures 320, the ends 326 of the pin-like members can be solder bonded directly to the surface of electrical conductors, such as conductors 322 and 324 of flex 302.

In one embodiment, the pin-like member 318 is formed from two electrical conductors on either side of an extension of the dielectric base layer 311 of first flex 300. The base layer 311 has a crenellated edge forming a plurality of pin-like members. Each pin-like member 318 can have more than one conductor on each side.

In another embodiment, the pin-like members 318 of FIG. 10 are a special structure formed from leads of flexible circuits or TAB-like flexes that can contain a certain amount of solder. The amount of solder is large enough to allow the flexes to be soldered reliably on a secondary substrate at any angle.

In order to increase packaging density, it is desirable to mount chips, especially memory chips, vertically on a substrate or printed-wiring board whenever such a configuration permits sufficient heat dissipation is. However, to solder leads vertically, or in general, at an arbitrary angle on a substrate is not an easy task. The yield and reliability of the solder joints are big concerns. The lead structures to be disclosed here will mitigate these concerns and result high-yield and reliable solder joints between two angled circuits.

Figure 11:
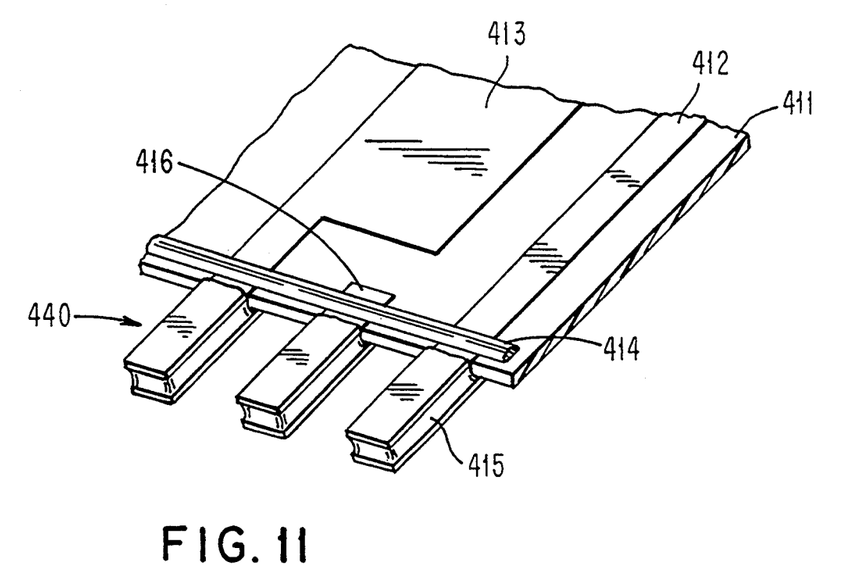
FIG. 11 show details of a solder bonded lead assembly which can be inserted into the apertures shown in FIG. 10. The lead assembly is sheared orthogonal to the leads.

A perspective view of the solder-well structure of a flexible circuit is shown in FIG. 11. A flexible circuit consists of a polymer film 411, signal lines 412, ground or power lines 413, and auxiliary lines 416. The lines are conductors which are typically made of copper coated with noble metals or any material that conducts electricity and allows solder to wet on it. The pattern of these conductors on the polymer film depends on the circuits to be interconnected. The solder well 415 is formed by the extended portion of two conductors on both sides of the polymer film 411 which forms a pin-like structure 440 of FIG. 11 and 442 of FIG. 12. The conductors could be both signal lines, both ground (or power) lines, signal and auxiliary lines, and ground and auxiliary lines. Solder is disposed in the well by dipping the well into a pot of molten solder or by other solder deposition tools. The amount of solder remaining in the well depends on the wetting angle of the molten solder on the conductor surface, the length and width of the extended portion of the conductors, the thickness of the polymer film 411, and the degree of parallelism of the extended portion of the conductors. An optional solder dam 414 of nonsolder wettable material such as a performa of polyimide, can be placed near the well area to avoid solder spreading during solder deposition and reflowing. Once the solder-well is prepared, the tip of the well may be sheared away in a designated angle by shearing, micromachining, grinding, or other mechanical and chemical operations, to result in the structure shown in FIG. 12. (The solder filled pin-like structure can be fabricated using any type of dielectric substrate, e.g. a polymer, ceramic, glass composite and the like.)

Figure 13:
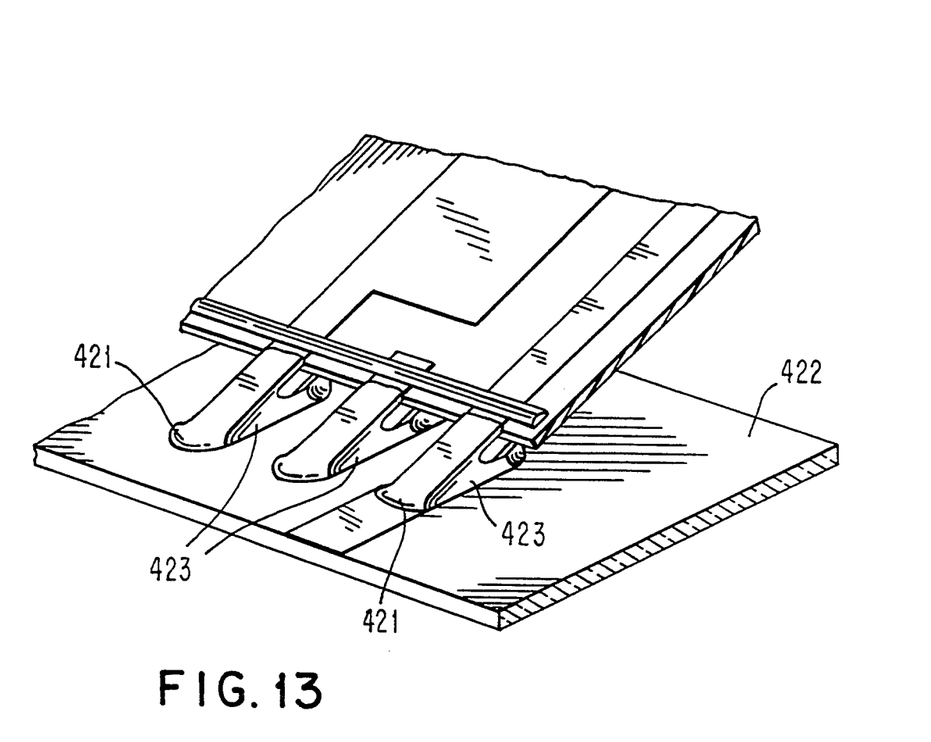
FIG. 13 shows a perspective view of the lead assembly of FIGS. 11 and 12 solder bonded at a nonorthogonal angle to the surface of electrical conductors on a substrate.

The resulting solder joints 421 on a substrate 422 are shown in FIG. 13 after solder reflowing. Note that after reflowing, part of the solder from the well has flowed from the well to form a solder fillet 423 around the leads. Because the amount of solder in the solder well can be controlled, the size of each solder fillet can also be controlled. This is important when the connection pitch gets smaller. Furthermore, because solder is held by the leads, there is no need to control the thickness of solder on the solder-pads at the pre-tinning operation of the substrates.

Figure 14:
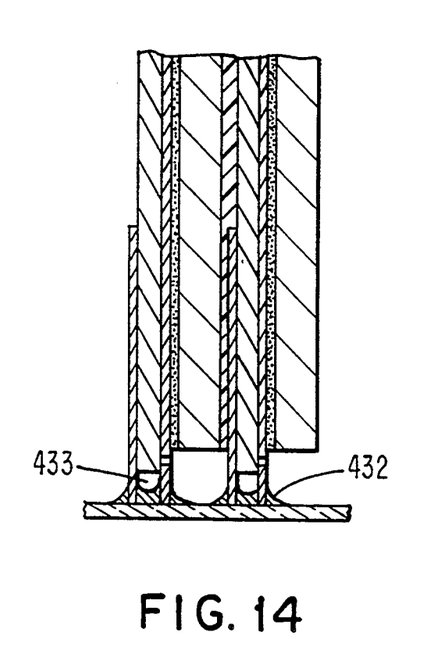
FIG. 14 shows a side view of the lead assembly of FIG. 11 solder bonded at an orthogonal angle to the surface of electrical conductors on a substrate.

One application of the solder-well structured leads is to solder TAB chips vertically or at an angle on a printed-wiring board or other substrate, such as another flex substrate as shown in FIG. 1. The side view of this application is shown in FIG. 14, in which the solder fillet 432 are formed around the solder well 433.

Figure 12:
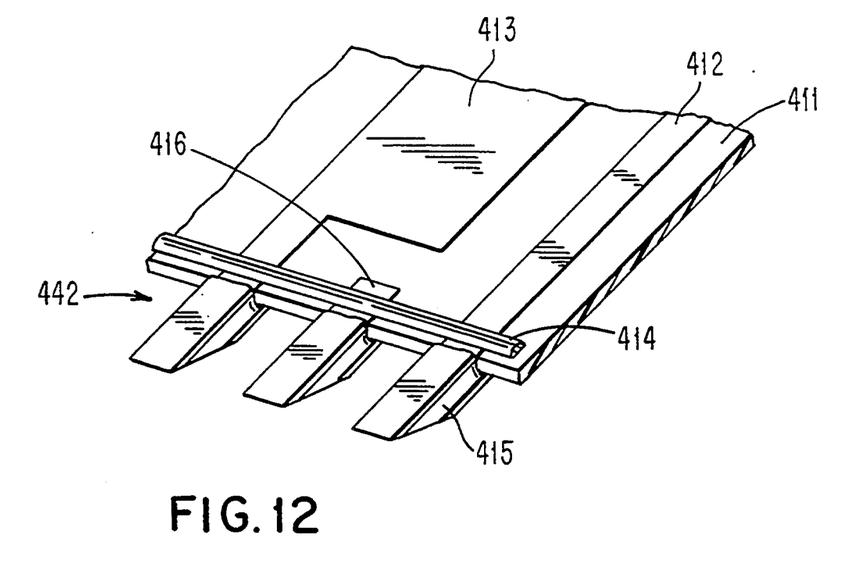
FIG. 12 shows a lead assembly sheared at a nonorthogonal angle.

Returning to the structure of FIG. 1, pin-like structure 440 of FIG. 11 and 442 of FIG. 12 correspond to the pin-like structure 444 of FIG. 1 which is schematically shown, in perspective, as 318 in FIG. 10.

Figure 15:
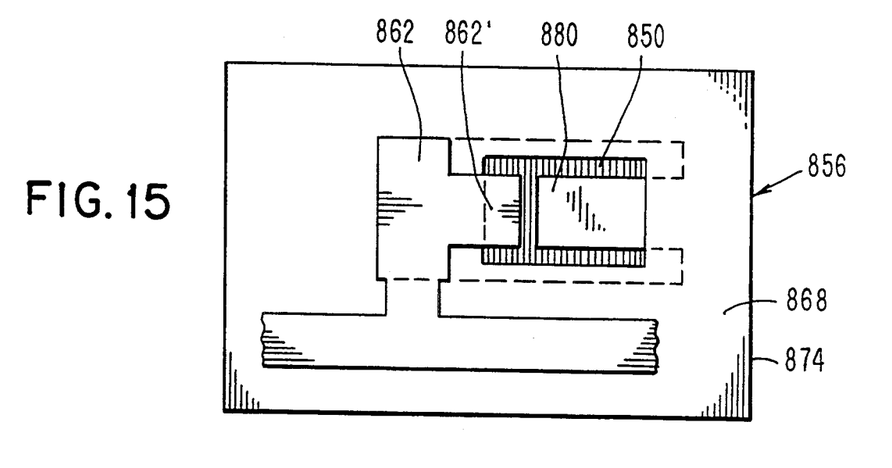
FIGS. 15, 16, and 17 show alternative designs for the split via apertures, 23 of FIG. 5.
Figure 16:
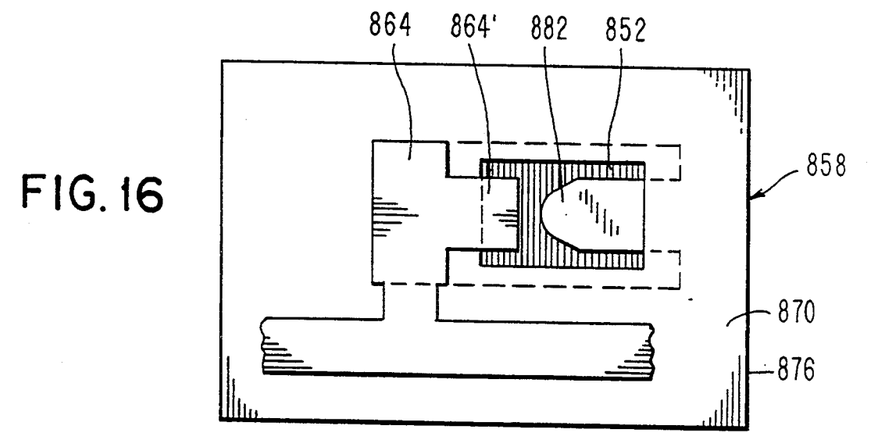
Figure 17:
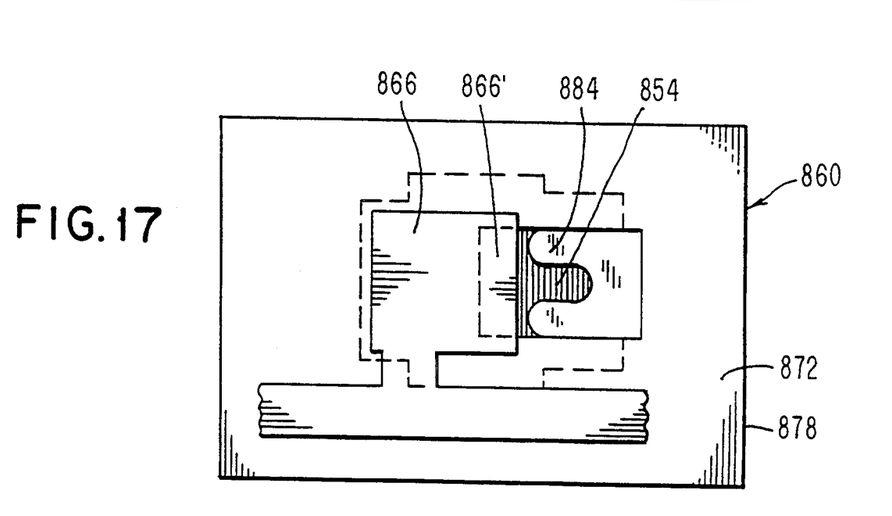

To connect the chips 11 of FIG. 1 to the second flex 21, pin-like structures 444 are inserted into holes 23. FIGS. 15, 16 and 17 show a top view of three possible configurations of this hole. In FIGS. 15, 16 and 17, elements 850, 852 and 854, respectively, are the apertures in the dielectric layer 856, 858 and 860, respectively, which form via 23 in FIG. 1. Electrical conductor patterns 862, 864 and 866 on sides 868, 870 and 872, respectively, partially overlap vias 850, 852 and 854, respectively, as extensions 862', 864' and 866' respectively. On nonvisible sides 874, 876 and 874 there is a ground plane having an opening shown in phantom except where it is visible through vias 850, 852 and 854 as conductor extensions 880, 882 and 884, respectively.

The combinations 862/880, 864/882 and 866/884 provide the engagement means for the pin-like structure 318 of FIG. 10 when inserted into aperture 320. The engagement means provides a retentive force on the pin-like member 318 in aperture 320.

Figure 18:
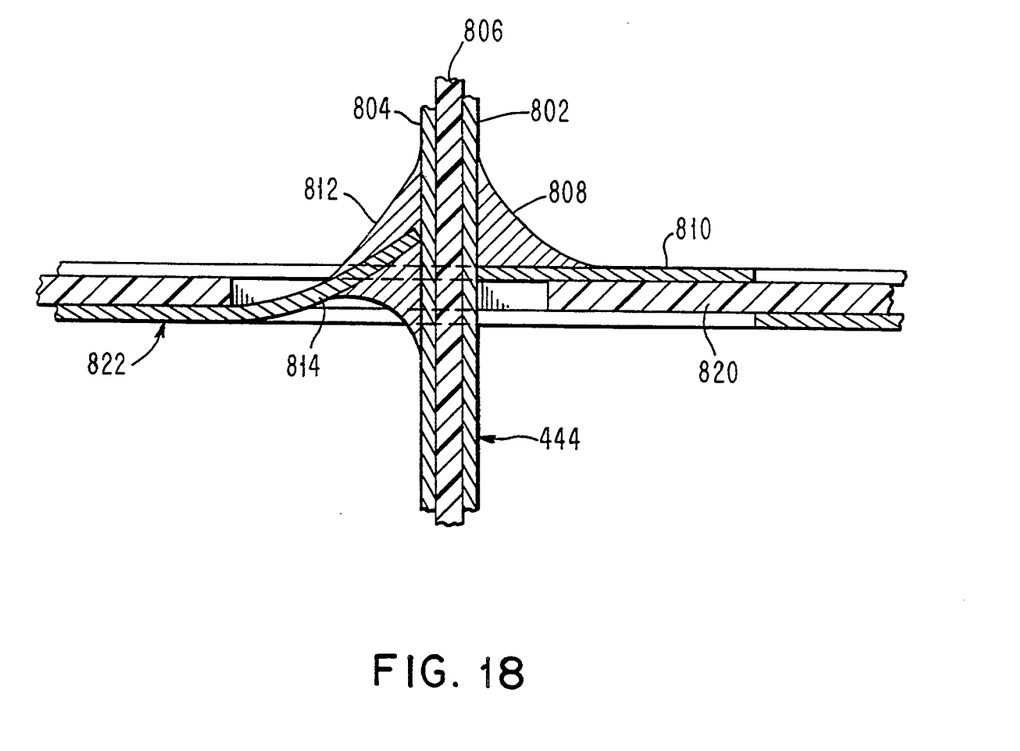
FIG. 18 is an enlarged cross-sectional view through the via interconnection region of FIG. 7.

When pin 444 is inserted into hole 23, two independent contacts are made. This is shown in FIG. 18 which is an enlarged view of the region of via 23 of FIG. 7. The signal side of pin 444 is surface 802, and the ground side is surface 804. Surfaces 802 and 804 are separated by dielectric 806. Solder fillet 808 electrically and mechanically connects conductors 802 of the first flex 444 to the top surface wiring 810 of second flex 822. Solder fillet 802 connects ground plane 814 of the second flex 822 to conductor 804 of the first flex 444. Dielectric layer 820 is disposed between wiring 810 and ground plane 814. Note that protrusion 814 has been forced up by the insertion of pin 444. Possible shapes of this protrusion are shown in FIGS.15-17. There is a trade off between a close contact between the bonding surfaces 802/810 and 804/814 with the ability of remove pin 444 upon heating of solder fillets 808 and 812. Surface 804 has been cut short at dotted line 404 (shown in FIG. 9), to minimize the possibility of bridging the two solder fillets 808 and 812. This cannot be done for all leads, since aground plane connection must be maintained for testing purposes. In one design, the two ground leads at the outer edges of the first flex remain connected to the readout pads. Solder fillets 808 and 812 are simultaneously formed by either wave soldering the entire set of all pins or preferably by soldering one row of pins at a time as each chip and flex is inserted into the second flex. An apparatus for making this solder connection is described in U.S. Pat. No. 4,898,117, the teaching of which is incorporated herein by reference.

It is to be understood that the above described embodiments are simply illustrative of the principles of the invention. Various other modifications and changes may be devised by those of skill in the art which will embody the principles of the invention and fall within the spirit and scope thereof.

We claim:

1. A structure comprising:
   at least one first substrate;
   said at least one first substrate has a first side and a second side;
   said first side of said at least one first substrate has a plurality of electrical conductors disposed thereon;
   at least one electronic device is disposed in electrical connection with at least a part of said plurality of said electrical conductors to form at least one assembly;
   said electrical conductors extend to a first edge of said at least one substrate;
   said conductors at said edge being substantially linear and free of bends;
   a second substrate having a plurality of conductors disposed on at least a first side thereof;
   said second substrate has a second side which is disposed adjacent a first side of a resilient member and;
   said conductors at said edge of said at least one first substrate being disposed adjacent to at least a part of said plurality of conductors on said second substrate and being electrically connected thereto.

2. The structure of claim 1, further including:
   at least one aperture in said second substrate;
   said aperture being adapted to receive said edge of said at least one first substrate; and
   at least a part of said conductors on said second substrate extend to said at least one aperture.

3. The structure of claim 1, wherein said first substrate is orthogonal to said second substrate.

4. The structure of claim 1, wherein there are a plurality of said at least one assembly and a plurality of apertures in said second substrate, each of said plurality of apertures are adapted to receive said edge of one of said plurality of first substrates of said at least one assembly, said plurality of apertures are disposed so that each of said assemblies is adjacent another of said plurality of assemblies.

5. The structure of claim 4, wherein said at least one electronic device of one of said adjacent assemblies is adjacent said second side of the other of said adjacent assemblies.

6. The structure of claim 5, wherein said at least one electronic device of one of said adjacent assemblies is disposed against said second side of the other of said adjacent assemblies.

7. The structure of claim 1, wherein said electronic device is selected from the group consisting of semiconductor chips, semiconductor chip modules, decoupling capacitors and packaging substrates.

8. The structure of claim 7, wherein said semiconductor chips are selected from the group consisting of memory and logic chips.

9. The structure of claim 1, further including an encapsulant disposed on at least a part of said at least one electronic device.

10. The structure of claim 1, further including at least one electronic device on said second side of said at least one first substrate.

11. The structure of claim 1, wherein said at least one first substrate comprises a flexible polymer film.

12. The structure of claim 1, wherein said second substrate comprises a flexible polymer film.

13. The structure of claim 1, wherein said second side of said first substrate has an electrical conductor forming a ground plane.

14. The structure of claim 1, further including a heat dissipation means in thermal contact with said at least one assembly.

15. The structure of claim 1, wherein said electrical conductors in said first substrate are electrically interconnected to electrical contact locations on said at least one electronic device by a plurality of wires.

16. The structure of claim 1, wherein a portion of said electrical conductors of said first substrate have conductor ends which cantilever over a second edge of said at least one first substrate, said conductor ends being electrically interconnected to electrical contact locations on said electronic device.

17. The structure of claim 1, wherein said first side of said at least one first substrate is adhesively attached to said electronic device.

18. The structure of claim 1, wherein at least one of said electrical conductors cantilevers off of said first edge to form a first cantilevered lead, wherein an electrical conductor cantilevers off of said first edge from said second side of said at least one first substrate to form a second cantilevered lead, said first cantilevered lead and said second cantilevered lead being aligned and substantially disposed opposite to each other with a space therebetween to form a lead assembly.

19. The structure of claim 18, wherein there are a plurality of said lead assemblies.

20. The structure of claim 18, wherein said space of said lead assembly contains solder which provides said electrical interconnection between a part of said plurality of electrical conductors on said first substrate and a part of said plurality of electrical conductors on said second substrate.

21. The structure of claim 20, further including at least one aperture in said second substrate; said aperture being adapted to receive said beam lead assembly; and said conductors on said second substrate extend to said at least one aperture.

22. The structure of claim 18 wherein said lead assembly being soldered to said electrical conductor on said second substrate.

23. The structure of claim 22, further including an aperture in said second substrate adopted to receive said lead assembly.

24. The structure of claim 18 wherein said first substrate is a nonorthogonal arrangement with respect to said second substrate.

25. The structure of claim 24, wherein said first and said second cantilevered leads have different length to accommodate said nonorthognal arrangement of said first substrate with respect to said second substrate.

26. The structure of claim 1, further including an electrically conductive via between said first side and said second side of said at least one first substrate.

27. The structure of claim 1, wherein said first substrate is flexible.

28. The structure of claim 1, wherein said second substrate is flexible.

29. The structure of claim 1, wherein
said edge has at least one projection;
a first electrical conductor on said first side;
a second electrical conductor on said second side;
said first electrically conductor has a first portion which extends onto said at least one projection;
said second electrical conductor has a second portion which extends onto said at least one projection;
said first portion of said first conductor and said second portion of said second conductor being substantially aligned and opposite to each other forming a lead assembly.

30. The structure of claim 1, wherein said edge has at least one projection having an electrical conductor on at least one side thereof.

31. A structure comprising:
at least one first substrate;
said at least one first substrate has a first side and a second side;
said first side of said at least one first substrate has a plurality of electrical conductors disposed thereon;
at least one electronic device is disposed in electrical connected with at least a part of said plurality of said electrical conductors to form at least one assembly;
said electrical conductors extend to a first edge of said at least one substrate;
said conductors at said edge being substantially linear and free of bends;
a second substrate having a plurality of conductors disposed on at least a first side thereof;
said conductors at said edge of said at least one first substrate being disposed adjacent to at least a part of said plurality of conductors on said second substrate and being electrically connected thereto; and
said second substrate has a second side which is disposed adjacent a first side of a resilient layer.

32. The structure of claim 31, wherein said resilient layer has a second side which is disposed adjacent a third substrate.

33. The structure of claim 32, wherein said third substrate has electrical contact locations which are electrically connected to portions of said electrical conductors on said second substrate.

34. The structure of claim 32, further including a heat dissipation means pressed into contact with said lead assemblies so that said resilient layer is compressed.

35. The structure of claim 31, wherein said resilient material is an elastomeric material.

36. A structure comprising:
a plurality of first substrates;
each of said plurality of said first substrates has a first side and a second side;
said first side has a plurality of electrical conductors disposed thereon;

said second side has a plurality of electrical conductors disposed thereon;

at least one electronic device is disposed in electrical contact with said plurality of electrical conductors on said first side of said first substrate to form a plurality of first assemblies;

at least a portion of said plurality of electrical conductors on said first side extend to an edge of said first substrate and cantilever over said edge as a plurality of first cantilevered leads;

at least a portion of said plurality of said second electrical conductors disposed on said second side extend to said edge and cantilever over said edge as a plurality of second cantilevered leads;

each of said first cantilevered leads is aligned with one of said second cantilevered leads with a space therebetween containing solder to form a plurality of lead assemblies;

each of said plurality of first assemblies being disposed adjacent another one of said plurality of first assemblies so that said at least one electronic device of one of said adjacent assemblies is adjacent said second side of the other of said adjacent assemblies;

a second substrate having conductors, at least a portion of which extend to a plurality of apertures adapted to receive said plurality of lead assemblies;

said second substrate has a second side which is disposed adjacent a first side of a resilient member; and 37. A structure comprising:

at least one first substrate;

said at least one first substrate has a first side and a second side;

said first side of said at least one first substrate has a plurality of electrical conductors disposed thereon;

at least one electronic device is disposed in electrical connected with at least a part of said plurality of said electrical conductors to form at least one assembly;

said electrical conductors extend to a first edge of said at least one substrate;

said conductors at said edge being substantially linear and free of bends;

a second substrate having a plurality of conductors disposed on at least a first side thereof;

said conductors at said edge of said at least one first substrate being disposed adjacent to at least a part of said plurality of conductors on said second substrate and being electrically connected thereto;

said second substrate is flexible;

a second side of said second flexible substrate being disposed on a first side of a resilient layer;

a second side of said resilient layer being disposed on a third substrate; and said third substrate having a plurality of electrical conductors at least a portion of which are electrically connected to at least a portion of said electrical conductors on said third substrate.

38. The structure of claim 37, further including a heat dissipation means disposed in thermal contact with each of said first assemblies.

39. The structure of claim 37 wherein said first and said second substrates are flexible.

* * * * *